United States Patent [19]

Higuera et al.

[11] 4,394,123
[45] Jul. 19, 1983

[54] TILTABLE SUPPORT BRACKET FOR SLIDABLY SUPPORTING QUARTZ SUPPORT TUBES FOR SEMICONDUCTOR WAFER PROCESSING BOARDS, AND PROCESSING APPARATUS EMBODYING SUCH BRACKETS

[75] Inventors: Robert S. Higuera, Escondido; John F. Ryan, San Diego, both of Calif.

[73] Assignee: Northern Telecom, Inc., Nashville, Tenn.

[21] Appl. No.: 347,175

[22] Filed: Feb. 9, 1982

[51] Int. Cl.³ ............................. F27D 5/00; F27D 3/00
[52] U.S. Cl. ..................................... 432/253; 432/239
[58] Field of Search ................. 432/253, 239; 104/137

[56] References Cited

U.S. PATENT DOCUMENTS

| 3,202,406 | 8/1965 | Tack | 432/239 |
| 3,669,431 | 6/1972 | Lenss et al. | 432/239 |
| 3,811,825 | 5/1974 | Enderlein | 432/253 |
| 3,819,067 | 6/1974 | Hammond | 432/253 |
| 4,075,972 | 2/1978 | Yamawaki et al. | 432/253 |

Primary Examiner—John J. Camby
Attorney, Agent, or Firm—Schwartz, Jeffery, Schwaab, Mack, Blumenthal & Koch

[57] ABSTRACT

In a semiconductor wafer processing apparatus, the support rails carrying the boats holding wafers are at least partially supported during insertion into and withdrawal from the furnace by one or more tiltable support brackets. Each bracket has two spaced pillars connected at their bases by a first member which is hingedly connected to a second member attached to a base surface of the furnace apparatus. A rotatable shaft extends between the top ends of the pillars. A projection extends from the first member. In use, as the furnace end plate is moved toward the furnace tube, pushing in the rails, the end plate folds down the, or each bracket as it contacts it. The projection passes up behind the end plate on folding down of a bracket. On reverse movement of the end plate, away from the furnace tube, the end plate contacts a projection and tilts up the related bracket. If a plurality of brackets are provided they are successively tilted up, back to a support position.

11 Claims, 7 Drawing Figures

TILTABLE SUPPORT BRACKET FOR SLIDABLY SUPPORTING QUARTZ SUPPORT TUBES FOR SEMICONDUCTOR WAFER PROCESSING BOARDS, AND PROCESSING APPARATUS EMBODYING SUCH BRACKETS

This invention relates to tiltable support brackets for slidably supporting rails on which are carried boats containing semiconductor wafers for processing. The invention also relates to processing apparatus embodying such brackets.

Quartz boats, carring wafers, are supported on two parallel rails, usually of quartz or silicon. The ends of the rails are interconnected, usually at both ends. The rails, carrying the boats, are slid into a furnace, in which the wafers are treated or processed, the rails being slid in and out by means of a feed mechanism connected to an end cap or plate, which normally seals the open, entry, end of the furnace when the support rails are fully inserted. A hook extending from the front or inner face of the end cap or plate engages in a small loop or similar structure formed on the interconnecting member at the outer ends of the rails.

The feed mechanism is actuated, normally, by a control system and in conventional forms of apparatus the support rails slide at all times on the inner surface of the furnace tube. The rails may be loaded with boats and then the inner ends of the rails inserted into the open end of the furnace tube, the loop at the outer ends resting on the hook extending from the end cap or plate. The rails are thus supported initially only at each end.

As the rails are pushed into the furnace tube, vibration can occur. This may be due to roughness developed on the rails during processing and/or roughness on the inner surface of the furnace tube. Sometimes the vibration can build up to dangerous levels and breakage of one or both support rails can occur. This results in boats, and wafers also being dropped with possible breakage of boats and damage to wafers. If the rails have been partially inserted before breakage occurs, boats and wafers can fall down onto the inner surface of the furnace tube and have to be retrieved. The furnace tube will be at operating temperature at this time and therefore it can be difficult to retrieve boats and wafers and breakage of the furnace tube itself may also occur.

The present invention provides a tiltable bracket which acts to support the support rails as they are slid into the furnace, the bracket being hinged down by the end cap or plate to enable the end plate to close off the open end of the furnace tube. On withdrawal of the end cap or plate, and support rails, from the furnace the end cap or plate engages a projection on the bracket to cause it to pivot up and support the rails. More than one such bracket can be provided depending upon the length of the support rails and the weight being carried.

Broadly a bracket has two spaced pillars, at the top ends of which are bearings rotatably holding a round shaft extending between the pillars. The bottom ends of the pillars are attached to a first member of two members hingedly connected. The second member is adapted to be attached to a base surface of an apparatus. A projection extends up from the first member. An end plate of a furnace pushes against the pillars as the plate moves towards the furnace and hinges the bracket over and down for passage of the end plate. On reverse movement of the end plate, it engages with the projection from the first member and hinges the bracket up after passage of the end plate.

The invention will be readily understood by the following description of certain embodiments of the invention in conjunction with the accompanying drawings, in which.

Figure 1:
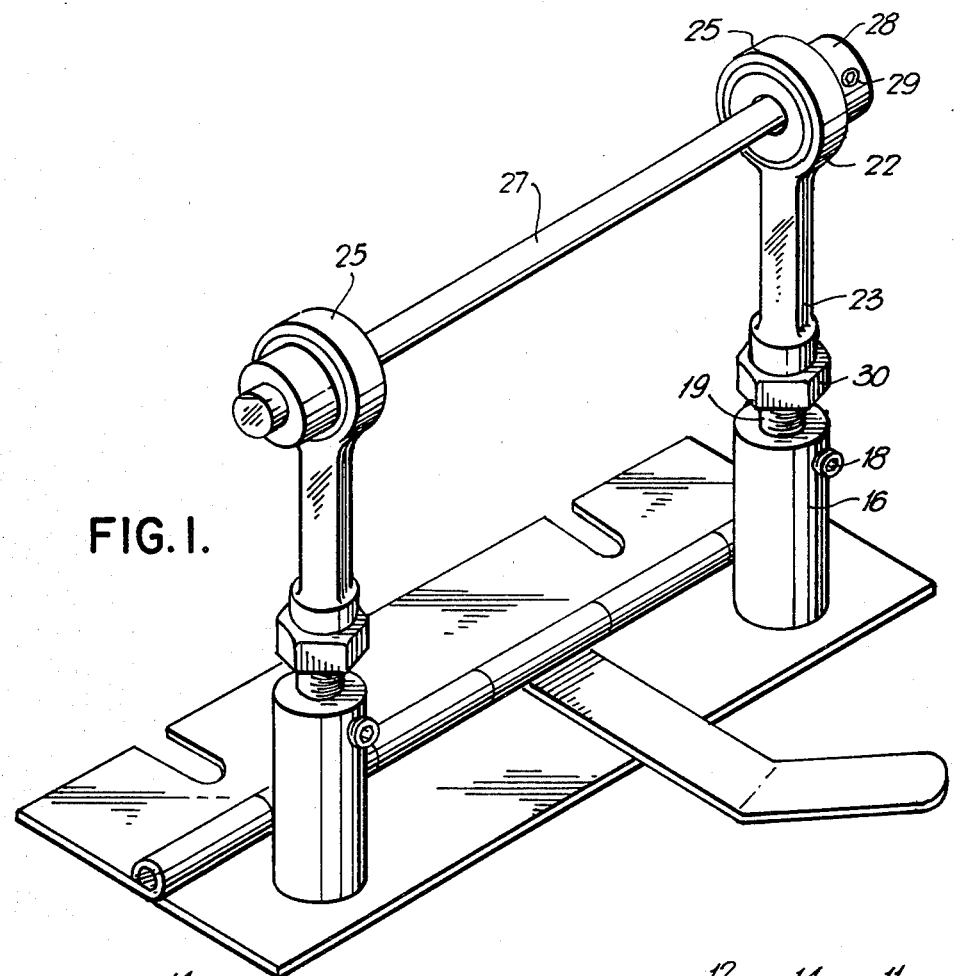
FIG. 1 is a perspective view of one form of bracket.
Figure 2:
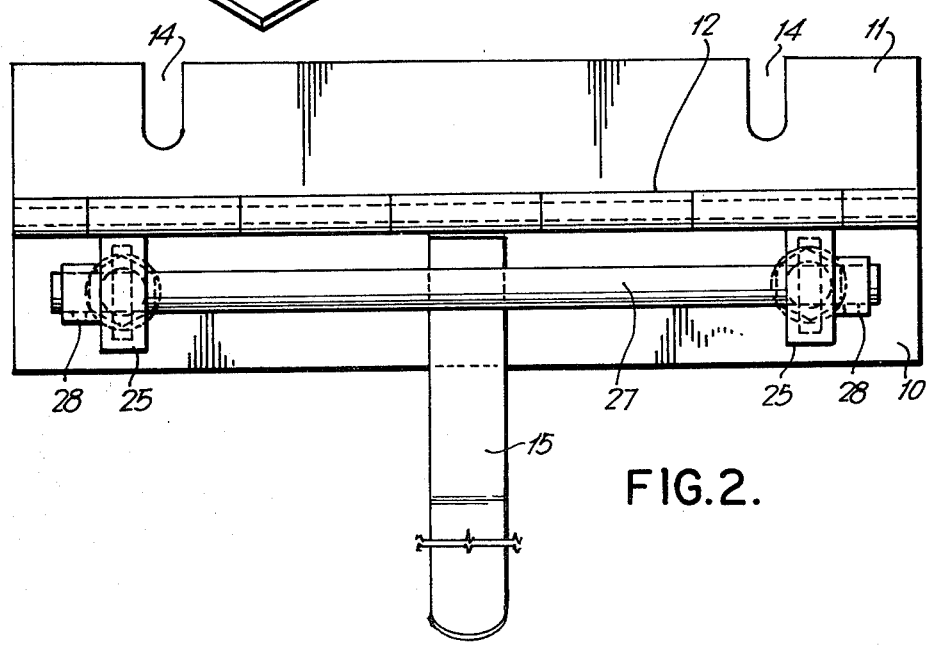
FIGS. 2, 3 and 4 are top, rear and side views respectively of the bracket of FIG. 1.
Figure 3:
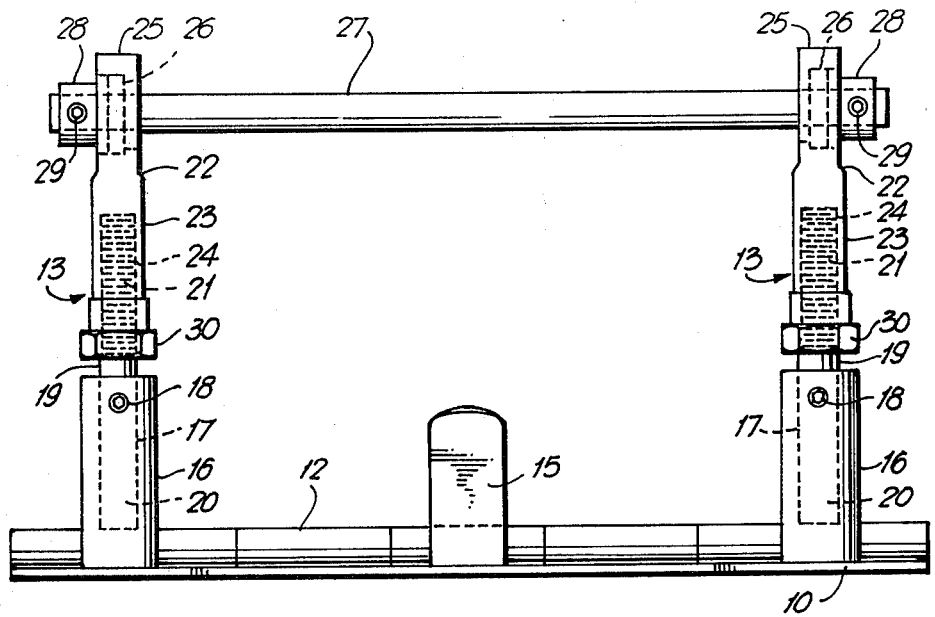
Figure 4:
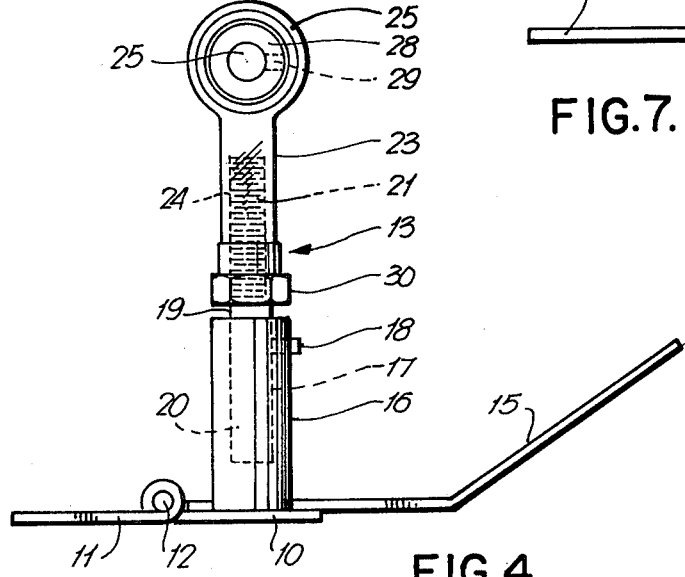

As illustrated in FIG. 1, and also in FIGS. 2, 3 and 4, a bracket has two flat members 10 and 11 hingedly connected at 12. On the first flat member 10 are two spaced apart pillars, indicated generally at 13. In the example the second flat member 11 has two slots 14 through which are passed screws for attachment to a base surface of a processing apparatus. Extending rearwards, and upwards from the first flat member 10 is a projection or lever 15. The lever 15 extends to a lower height than the pillars.

Considering the pillars 13 in more detail, in the example illustrated, each pillar is comprised of three main parts. A base 16 is attached at its lower end to the flat member 10 and has a bore 17 extending down from its top end. If desired the base 16 can be formed of tube. A screw 18 extends through the side of the base to the bore 17. A central part 19 has a lower portion 20 a sliding fit in the bore 17 and can be locked in position by the screw 18. The central part also has a threaded upper portion 21. A top part 22 has a lower portion 23 which has a threaded bore 24 into which screws the threaded upper portion of the central part. The top member 22 also has a top portion 25 within which is mounted a bearing 26. The rotational axes of the bearings in the two pillars are coaxial and a shaft 27 is mounted at each end in the bearings. The bearings 26 are conveniently ball bearings. Collars 28 on the ends of the shaft 27 ensure positioning of the shaft 27, the collars locked in position by screws 19. A lock nut 30 can be provided on the threaded upper portion 21 of the central part.

To provide for adjustment of the height of the shaft 27, to suit variations in various different furnaces, and to provide for individual adjustment to meet variations in the level of the surface on which the brackets are mounted in a particular furnace, the construction provides two stages of adjustment. Thus a relatively coarse adjustment is provided by movement of the lower portion 20 of the central part 19 in and out of the bore 17 of the base 16, and being held in any desired position by the screws 18. A finer adjustment is provided by rotating the top part 22 on the threaded upper part 21 of the central part 19. To do this latter adjustment the shaft 27 must be removed from the bearings 26. The shaft 27 is made to be a relatively easy slide fit in the bore of the bearing. The sliding movement to be supported by the shaft 27 is relatively slow and the requirement of the bearings 26 is to provide a smooth movement, the loading of the bearings being very low.

In operation, the end plate of the furnace assembly approaches from the right in FIGS. 1 and 4 when a furnace is being loaded, the support rails resting, and sliding, on the shaft 27. The end plate contacts the pillars 13 and they pivot or hinge over, on the flat member 10, eventually dropping down until the top parts 25 rest on the mounting surface, the lever 15 extending up behind the end plate. On withdrawal from the furnace the end plate passes over the pillars 13 and contacts the lever 15. As the end plate continues to move, to the right in FIGS. 1 and 4, the lever acts to pivot the flat member 10 and attached pillars 13 until the pillars are upright and the shaft moves under, and supports, the support rails.

Figure 5:
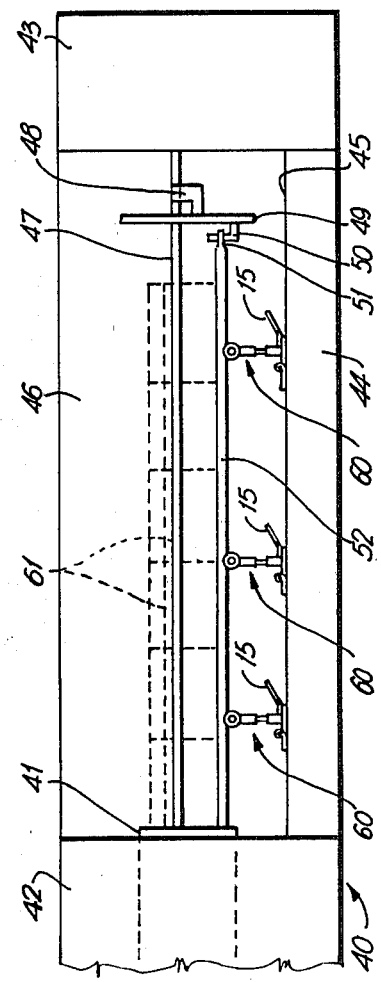
FIGS. 5 and 6 illustrate very diagrammatically an apparatus embodying brackets as in FIGS. 1 to 4, illustrating the operation of the brackets.
Figure 6:
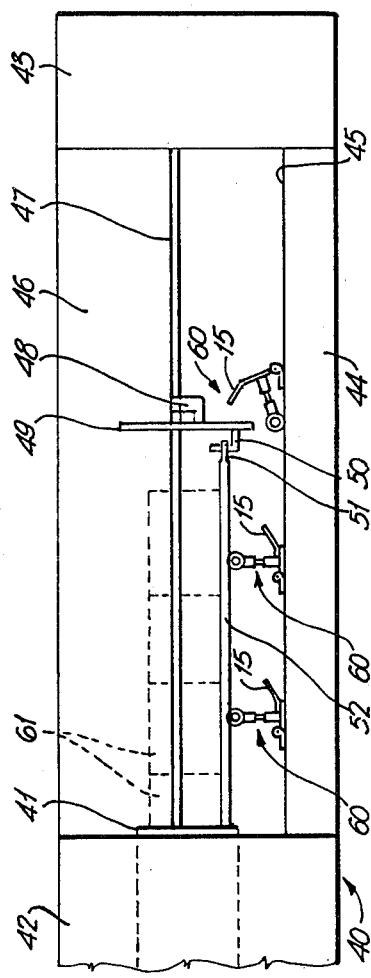

FIGS. 5 and 6 illustrate very diagrammatically one particular arrangement of furnace embodying brackets as described above. The furnace, indicated generally at 40, has a furnace tube 41 supported therein at one end. Only the front part of the furnace tube 41 and surrounding enclosure 42 is shown, the enclosure extending for the length of the furnace. At the rear end are the means for supplying the various gases and vapours to the furnace tube, with associated control means. This is conventional and is of normal form, well known. At the other end of the furnace is a further enclosure, indicated at 43, which can contain indicators, control input devices and similar items. Extending between the enclosures 42 and 43 is a base 44 with a top surface 45. Also extending between the enclosures 42 and 43 is a back wall 46 behind which runs the mechanism for inserting and withdrawing the support rails, boats and wafers. A typical form of mechanism is a threaded rod which is rotated by an electric motor mounted in enclosure 43. Rotation of the rod causes an actuating member to traverse, and the actuating member extends through a slot 47 in the back wall 46 and is attached to the furnace end plate. The actuating member is seen at 48 and the end plate at 49. Direction of rotation of the threaded rod determines the direction of movement of actuating member 48, and thus the end plate 49. Again this mechanism is conventional.

Figure 7:
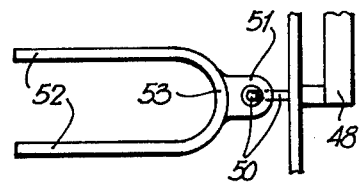
FIG. 7 is a partial top plan view of the connection between support rails, end plate and actuator.

Extending from the front surface of the end plate 49 is a hooked member 50. This hooked member engages in a loop or ring 51 at the outer end of the support rails 52. This is seen more clearly in FIG. 7, where the outer ends of the support rails 52 are shown connected together in a U-form, at 53, the loop or ring 51 extending from the U, and resting over the hooked member 50.

FIG. 5 illustrates the apparatus or furnace in the substantially fully withdrawn position, while FIG. 6 illustrates a partially inserted, or partially withdrawn, position. In the arrangement of FIGS. 5 and 6, three support brackets are provided, at 60. In FIG. 5 the inner ends of the support rails 52 are inserted in the open end of the furnace tube and the rails are supported on the brackets 60. Boats are indicated in dotted outline at 61, resting on the rails 52.

As the actuator moves to the left, in FIG. 5, the support rails, and boats, move into the furnace tube, the end plate 49 moving towards the outermost bracket 60. Eventually the end plate contacts the bracket and as movement continues the bracket pivots over and eventually drops down, permitting the end plate to continue over the bracket. Lever 15 tips up behind the end plate. This situation is illustrated in FIG. 6.

Continued movement of the actuator, and end plate, continues insertion of rails 52 and boats 61, and each bracket 60 is progressively tipped over and down. The support rails are increasingly supported by the inner surface of the furnace tube as the rails are inserted, although the rails are at least partially supported by the brackets for the majority of their travel. By the time the last bracket has been tipped over, the length of rails 52 extending out of the open end of the furnace tube is relatively short and vibration is substantially reduced. With a long length of the rails extending out of the furnace tube, unsupported, as is conventionally the case, the rails are somewhat flexible and thus any vibration can build up to quite serious levels. Also, support of the rails, and boats, by the brackets, relieves the actuator 48 from having to support at least a substantial portion of the weight of boats and wafers and also reduces the possibility of vibration arising from the actuator.

Eventually the end plate 49 is closed against the outer end of the furnace tube, and the process or treatment proceeds. At the end of the process cycle, the rails and boats are withdrawn from the furnace tube. The actuator 48 moves the end plate 49 to the right, in FIGS. 5 and 6, and as the end plate moves over the first bracket 60, which will be in the down position, the end plate contacts the lever 15 and continued movement of the end plate pivots up the bracket until the shaft 27 supports the support rails. Continued outward movement of the end plate successively pivots up the brackets 60.

The number of brackets provided can be varied, depending upon the length of the support rails 52 and the weight of the boats and wafers to be supported by the rails 52. It is the length of support rail which is itself unsupported which creates the problem of unacceptable vibration, resulting in possible breakage, and spilling of boats and wafers.

The brackets are usually designed so that when pivoted to an upright position by interaction between end plate and levers 15, center of gravity of the pillars 13 and shaft 27 moves over the pivotal axis at 12 and the brackets continue to an upright position even after contact between end plate and lever ceases.

The particular form of the lever 15 can vary depending upon the particular form of the end plate. The lever can be central, offset, or more than one lever can be provided. Also, the actual form of the pillars 13 can vary. For example, the threaded portion can be the lower part, screwing into a threaded bore in the base 16. The upper portion of the central member is then an axially sliding fit in a bore in the top member. Another alternative is with both upper and lower parts of the central member being threaded, cooperating with threaded bores, in the base and top member. If desired only one stage of adjustment need be provided. Other variations in the pillars 13 can readily be appreciated. The second member 11 while described and illustrated as a single flat member, can be of other forms. While a single member 11 is more convenient, the member could comprise two, or more, independent sections, each hingedly attached to the first member 10. The term second member is intended to cover one continuous member, or a plurality of sections cooperating together as a unit.

What is claimed is:
1. A tiltable support bracket comprising;
two spaced apart pillars;
a rotatable shaft extending between upper ends of said pillars;
a first member attached to and connecting lower ends of said pillars;
a second member hingedly connected to said first member for tilting of said first member about a hinging axis parallel to the rotational axis of said rotatable shaft;
said second member including means for attaching the second member to a support surface;

a projection extending from said first member on a side of said hinging axis remote from said second member;

the arrangement such that contact with said pillars by a third member moving in a first direction will tilt said pillars about said hinging axis to a substantially horizontal position with said projection extending up behind said third member, said third member engaging with said projection on reverse movement of said third member to tilt said pillars about said hinging axis to an upright position.

2. A support bracket for slidably supporting support rails carrying semiconductor wafer boats into and out of a processing furnace, comprising:

two spaced apart pillars;

a rotatable shaft extending between the top ends of said pillars;

a first member attached to and connecting bottom ends of said pillars;

a second member hingedly connected to said first member for hinging of said first member about a hinge axis parallel to the rotational axis of said rotatable shaft;

said second member adapted for attachment to a base surface of a processing apparatus;

at least one projection extending from said first member on a side of said hinge axis remote from said second member;

the arrangement such that on sliding of said support rails into said furnace, contact between a member connected to said rails and said pillars hinges said pillars about said hinge axis to a substantially horizontal position, and on sliding of said support rails out of said furnace, contact between said member connected to said rails and said projection hinges said pillars about said hinge axis to an upright position.

3. A support bracket as claimed in claim 2, including means for varying the distance of said shaft from said first member.

4. A support bracket as claimed in claim 3, each said pillar including at least two parts, an externally threaded portion on one part engaged in an internally threaded bore in a second part; such that rotation of one part relative to the second part varies the distance of said shaft from said first member.

5. A support bracket as claimed in claim 3, each said pillar including at least two parts, on axial extension on one part entered in an axial bore in a second part; said axial extension slidable in said bore to vary said distance of said shaft from said first member; and means for locking said extension in said bore.

6. A support bracket as claimed in claim 3, each said pillar including three parts, a base part, a central part and a top part; a threaded interconnection between the central part and one of said top and base parts and an axially sliding interconnection between the central part the other of said top and base parts, each interconnection providing for a variation in said distance from said shaft to said first member.

7. A support bracket as claimed in claim 2, including a ball bearing at the top end of each pillar, said shaft extending through said bearings, and a collar on each end of said shaft outside of and adjacent to the related bearing.

8. A support bracket as claimed in claim 2, said first and second members comprising flat members, in abutting relationship, a hinge connecting said flat members.

9. A support bracket as claimed in claim 2, said projection extending away from said hinge axis, and extending partially upward.

10. A semiconductor processing apparatus including a furnace tube, an enclosure for said tube and a base extending relative to said housing; at least one support bracket mounted on said base; an end plate for closing said furnace tube; means for moving said end plate towards said furnace tube for closing said tube, and for moving said end plate away from said tube; and means connected to said end plate for attaching to support rails, whereby movement of said end plate towards said furnace tube pushes said support rails into said furnace tube; said support bracket comprising; two spaced apart pillars; a rotatable shaft extending between the top ends of said pillars for support of said support rails; a first member attached to and connecting bottom ends of said pillars; a second member hingedly connected to said first member for hinging of said second member about a hinge axis parallel to the rotational axis of said rotatable shaft; said second member attached to said base; at least one projection extending from said first member in a direction away from said hinge axis; said projection extending up from said first member to a height less than the lower edge of said end plate; the arrangement such that on movement of said end plate towards said furnace tube said support rails are initially at least partly supported on said shaft, continued movement of said end plate causes contact between said end plate and said pillars, said pillars being hinged over to permit passage of said end plate, reverse movement of said end plate producing contact between said end plate and said projection to hinge said pillars up to a support position.

11. Apparatus as claimed in claim 10, including a plurality of support brackets on said base spaced apart in the direction of movement of said end plate; the support brackets successively hinged downward on movement of said end plate toward said furnace tube, and successively hinged upward on movement of said end plate away from said furnace tube, said support rails supported by the shaft of said brackets where said brackets are in an upright position.

* * * * *